United States Patent
Hofmann et al.

[11] Patent Number: 6,014,398
[45] Date of Patent: Jan. 11, 2000

[54] NARROW BAND EXCIMER LASER WITH GAS ADDITIVE

[75] Inventors: Thomas Hofmann; Toshihiko Ishihara, both of San Diego; Palash P. Das, Vista; Alexander I. Ershov, San Diego, all of Calif.

[73] Assignee: Cymer, Inc., San Diego, Calif.

[21] Appl. No.: 09/082,139

[22] Filed: May 20, 1998

Related U.S. Application Data

[63] Continuation-in-part of application No. 08/947,474, Oct. 10, 1997.

[51] Int. Cl.[7] .................................................. H01S 3/22
[52] U.S. Cl. ........................ 372/60; 372/57; 372/100; 372/99
[58] Field of Search ............................ 372/57, 60, 100, 372/99

[56] References Cited

U.S. PATENT DOCUMENTS 5,835,529  11/1998  Das et al. .................................. 372/57
5,856,991   1/1999  Ersjhov ..................................... 372/57

*Primary Examiner*—Leon Scott, Jr.
*Attorney, Agent, or Firm*—John R. Ross, Esq.

[57] ABSTRACT

The present invention provides a very narrow band pulse excimer laser capable of producing pulses at a rate in the range of about 500 to 2000 Hz with enhanced energy dose control and reproducibility. Very small quantities of a stablizing additive consisting of oxygen or a heavy noble gas (xenon or radon for KrF lasers, or krypton, xenon or radon for ArF lasers), are added to the gas mixture. Tests performed show substantial improvements in energy stability with the addition of about 30 ppm of xenon to a KrF laser. Tests show improved performance for the ArF lasers with the addition of about 6–10 ppm of Xe or 40 ppm of Kr. In a preferred embodiment very narrow bandwidth is achieved on a KrF laser by reducing fluorine partial pressure to less than 0.10 percent and by increasing the reflectance of the output coupler to greater than 25 percent. In a preferred embodiment, prior art fused silica beam expansion prisms used in the prior art line-narrowing module were replaced with calcium fluoride prisms.

13 Claims, 14 Drawing Sheets

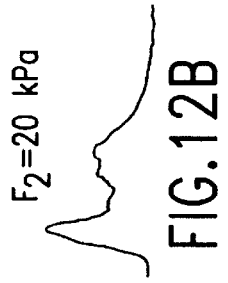
FIG.12A F₂=30 kPa
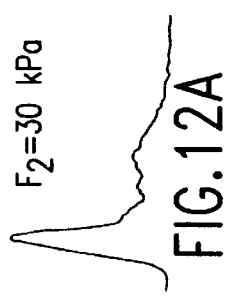
FIG.12B F₂=20 kPa
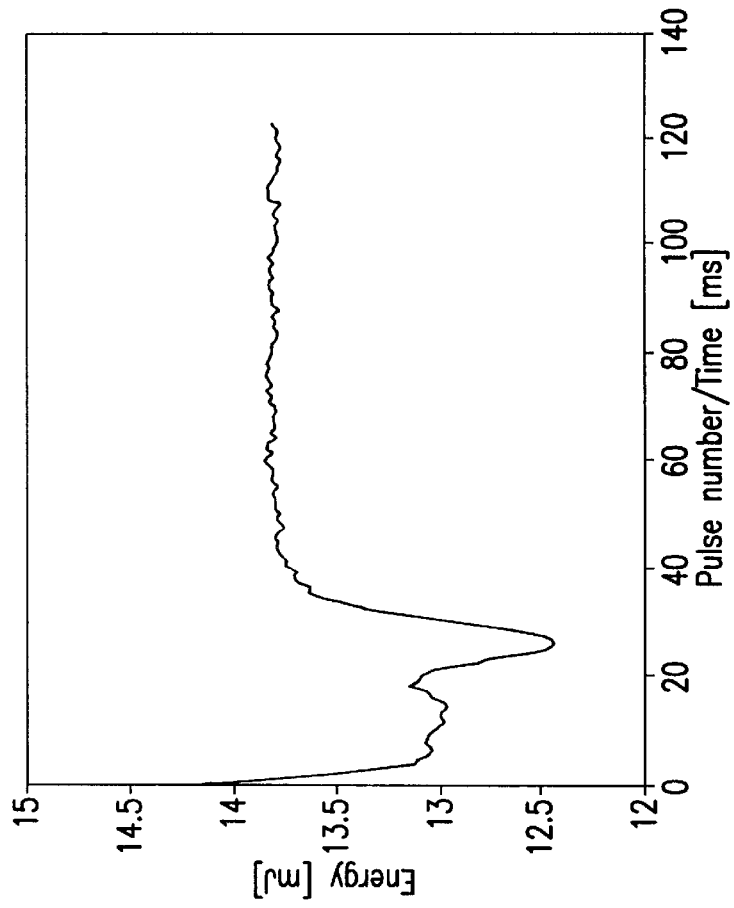
FIG.13

NARROW BAND EXCIMER LASER WITH GAS ADDITIVE

This is a Continuation-In-Part application of Ser. No. 08/947,474, Very Narrow Band KrF Laser, filed Oct. 10, 1997. This invention relates to lasers and in particular to narrow band lasers.

BACKGROUND OF THE INVENTION

Excimer lasers are currently becoming the workhorse light source for the integrated circuit lithography industry. A typical prior art KrF excimer laser is depicted in FIG. 1 and FIG. 9. A pulse power module AE provides electrical pulses lasting about 100 ns to electrodes 6 located in a discharge chamber 8. The electrodes are about 28 inches long and are spaced apart about ⅗ inch. Typical lithography lasers operated at a high pulse rate of about 1,000 Hz. For this reason it is necessary to circulate a laser gas (about 0.1 percent fluorine, 1.3 percent krypton and the rest neon which functions as a buffer gas) through the space between the electrodes. This is done with tangential blower 10 located in the laser discharge chamber. The laser gasses are cooled with a heat exchanger also located in the chamber. Commercial excimer laser systems are typically comprised of several modules that may be replaced quickly without disturbing the rest of the system. Principal modules are shown in FIG. 2 and include:

Laser Chamber 8,
Pulse Power Module 2,
Output coupler 16,
Line Narrowing Module 18
Wavemeter 20
Computer Control Unit 22
Peripheral Support Sub systems
Blower 10

The discharge chamber is operated at a pressure of about three atmospheres. These lasers operate in a pulse mode at about 600 Hz to about 1,000 Hz, the energy per pulse being about 10 mJ and the duration of the laser pulses is about 15 ns. Thus, the average power of the laser beam is about 6 to 10 Watts and the average power of the pulses is in the range of about 700 KW. A typical mode of operation is referred to as the "burst mode" of operation. In this mode, the laser produces "bursts" of about 50 to 150 pulses at the rate of 1,000 pulses per second. Thus, the duration of the burst is about 50 to 150 milliseconds. Prior art lithograph, excimer lasers are equipped with a feedback voltage control circuit which measures output pulse energy and automatically adjusts the discharge voltage to maintain a desired (usually constant) output pulse energy. It is very important that the output pulse energy be accurately controlled to the desired level.

It is well known that at wavelengths below 300 nm there is only one suitable optical material available for building the stepper lens used for chip lithography. This material is fused silica. An all fused silica stepper lens will have no chromatic correction capability. The KrF excimer laser has a natural bandwidth of approximately 300 pm (full width half maximum). For a refractive system (with NA>0.5)—either a stepper or a scanner—this bandwidth has to be reduced to below 1 pm. Current prior art commercially available laser systems can provide KrF laser beams at a nominal wavelength of about 248 nm with a bandwidth of about 0.8 pm (0.0008 nm). Wavelength stability on the best commercial lasers is about 0.25 pm. With these parameters stepper makers can provide stepper equipment to provide integrated circuit resolutions of about 0.3 microns. To improve resolution a narrower bandwidth is required. For example, a reduction of a bandwidth to below 0.6 pm would permit improvement of the resolution to below 0.25 microns.

Argon fluoride, ArF excimer lasers which operate at a wavelength of about 190 nm using a gas mixture of about 0.08 to 0.12% fluorine, 3.5% argon and the rest neon, are beginning to be used for integrated circuit lithography.

It is known that the addition of about 10 to 50 ppm of oxygen to an excimer laser gas mixture can be used to stabilize the efficiency and performance of the laser. See, for example, U.S. Pat. No. 5,307,364.

The actual performance of integrated circuit lithography equipment then depends critically on maintaining minimum bandwidth of the laser throughout its operational lifetime.

Therefore, a need exists for a reliable, production quality excimer laser system, capable of long-term factory operation and having accurately controlled pulse energy stability, wavelength, and a bandwidth.

SUMMARY OF THE INVENTION

The present invention provides a very narrow band pulse excimer laser capable of producing pulses at a rate in the range of about 500 to 2000 Hz with enhanced energy dose control and reproducibility. Very small quantities of a stablizing additive consisting of oxygen or a heavy noble gas (xenon or radon for KrF lasers, or krypton, xenon or radon for ArF lasers), are added to the gas mixture. Tests performed show substantial improvements in energy stability with the addition of about 30 ppm of xenon to a KrF laser. Tests show improved performance for the ArF lasers with the addition of about 6–10 ppm of Xe or 40 ppm of Kr. In a preferred embodiment very narrow bandwidth is achieved on a KrF laser by reducing fluorine partial pressure to less than 0.10 percent and by increasing the reflectance of the output coupler to greater than 25 percent. In a preferred embodiment, prior art fused silica beam expansion prisms used in the prior art line-narrowing module were replaced with calcium fluoride prisms.

BRIEF DESCRIPTION OF THE DRAWINGS

FIGS. 12A and 12B show pulse shape with different fluorine concentrations.

FIG. 13 is a chart of average pulse energy during the first 125 pulses during burst mode operation with no oxygen in the chamber where data from 50 bursts were averaged.

DETAILED DESCRIPTION OF PREFERRED EMBODIMENTS

Preferred embodiments of the present invention are described below.

DESCRIPTION OF LASER

Figure 1:
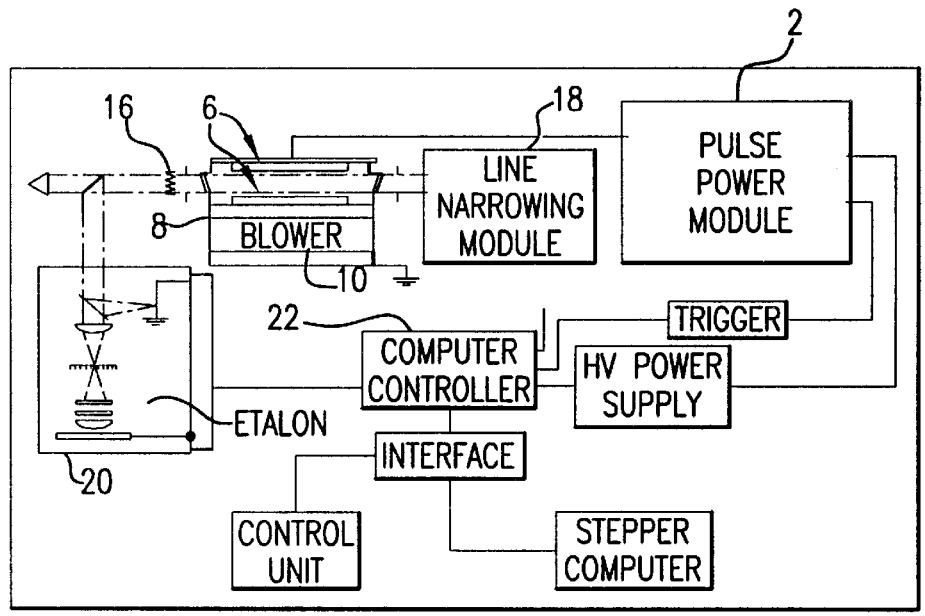
FIG. 1 is a drawing showing the principal elements of a prior art commercial KrF excimer lasers used for integrated circuit lithography.

FIG. 1 shows the principal elements of a commercial excimer laser system of the type used today in integrated circuit lithography.

The Chamber

The discharge chamber 10 is a vessel, designed to hold several atmospheres of corrosive gases. These vessels are designed to known safety standards, such as those specified by ASME. The two electrodes separated by a gap of 1.2 to 2.5 cm define the discharge region. The cathode is supported by an insulating structure since it is connected to the high voltage, while the anode is attached to the metal chamber as it is at ground potential. Preionization is done by corona discharge preionizers located on either side of the discharge region. Due to the corrosive nature of the gas the chambers use particular metals chosen to resist fluorine attack. The fluorine gas however, still reacts with the chamber internal parts such as chamber walls and electrodes; thus consuming fluorine and generating metal fluoride contaminants.

Since the laser is pulsed (500 to 2000 Hz), it is essential to clear the discharge region between pulses—a task preferably performed by a tangential blower, which is magnetically coupled to an external drive source. Heat is extracted from the laser gas by means of a water-cooled finned heat exchanger inside the chamber. Metal fluoride dust is trapped by means of an electrostatic precipitator not shown. A small amount of laser gas is extracted from the chamber and is passed over negatively charged high field wires to trap the dust. The dust-free gas is then released over the windows to keep them clean. The gas is driven through the precipitator by the differential pressure built up inside the laser chamber due to the high velocity flow.

Pulse Power Module

Figure 2:
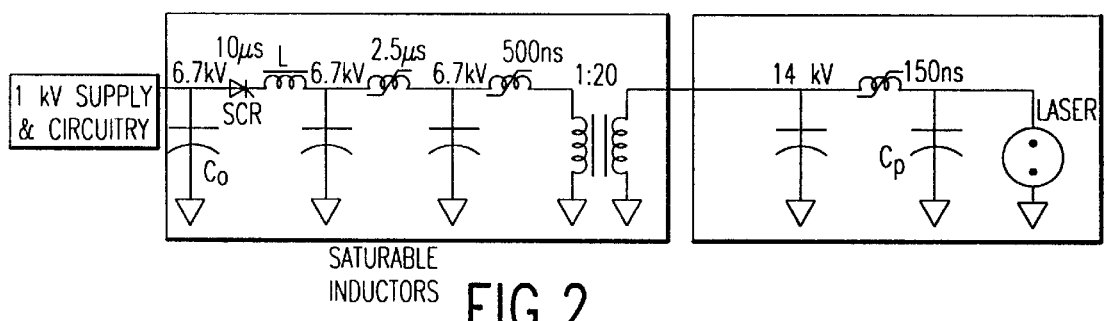
FIG. 2 is a simplified electrical drawing of a solid state pulse power circuit.
Figure 3:
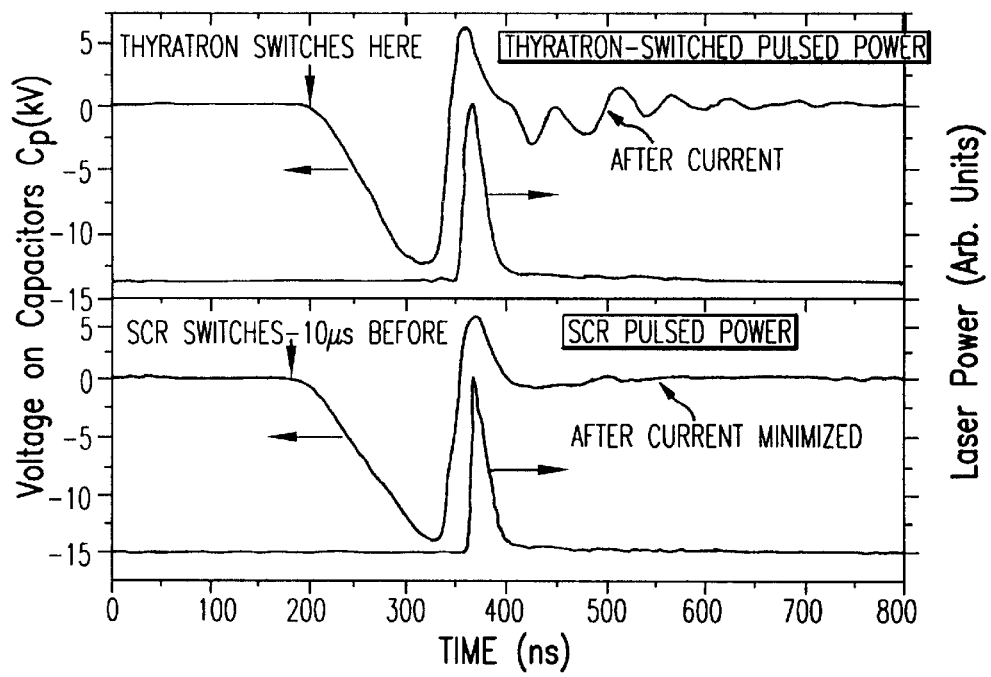
FIG. 3 are graphs comparing the results of a solid state pulse power circuit to a prior art thyratron based circuit.
Figure 4:
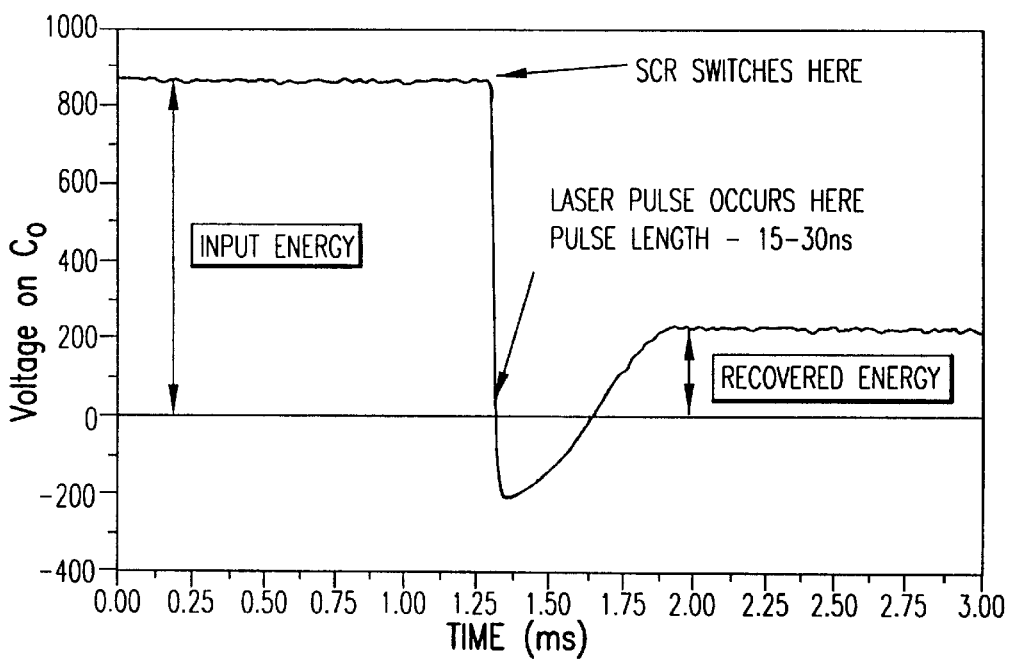
FIG. 4 is a graph of operating voltage during a pulse.
Figure 5:
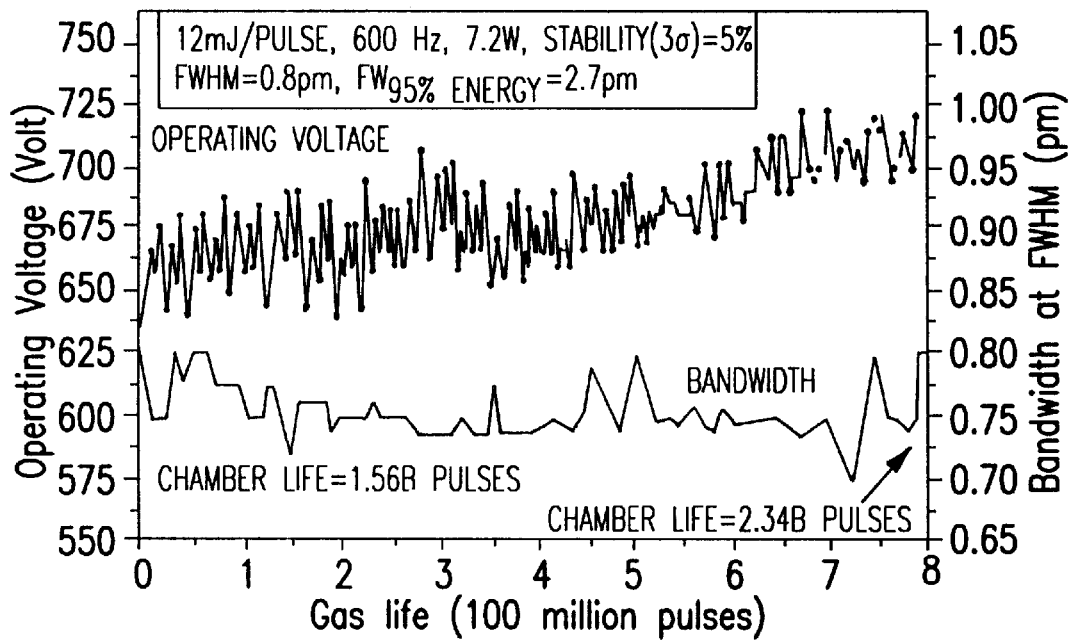
FIG. 5 shows a typical variation of operating voltage and bandwidth over an 800 million pulse period.
Figure 6:
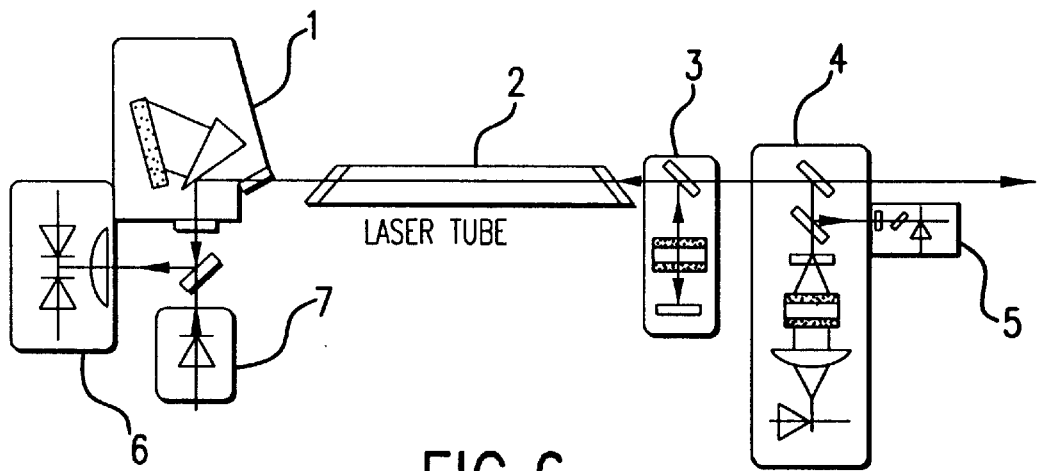
FIG. 6 is a simplified sketch of a KrF laser system.

This preferred embodiment utilizes a solid state pulsed power module (SSPPM) circuit shown in FIG. 2. The 20 KV power supply of prior art thyratron systems is replaced by a 1 kV supply. The thyratron switch is replaced by an SCR switch that does not feed $C_p$ directly, but instead switches the energy of $C_0$ into a pulse compression circuit formed by $C_1$, $C_2$, $C_3$, a step-up transformer, and three saturable inductors. The operation of this circuit is as follows. The DC charge stored on $C_0$ is switched through the SCR and the inductor $L_0$ into $C_1$. The saturable inductor, $L_1$, holds off the voltage on $C_1$ for approximately 2.5 ns and then becomes conducting, allowing the transfer of charge from $C_1$ to $C_2$. The second saturable inductor, $L_2$, holds off the voltage on $C_2$ for approximately 500 ns and then allows the charge on $C_2$ to flow through the primary of 1:20 step-up transformer. The output from the step-up transformer is stored on $C_3$ until the saturable inductor $L_3$ becomes conducting in approximately 100–150 ns. The charge is then finally transferred through $L_3$ into $C_p$ and laser discharge occurs.

Spectral Narrowing

As stated earlier, bandwidth (FWHM) of a free running KrF excimer laser is approximately 300 pm. Currently, excimer steppers utilize lasers spectrally narrowed to between 0.8 and 3 pm, FWHM, depending on the NA of the lens. It should be noted that the integrated energy spectrum and the spectral width at 95% energy are more critical to stepper performance than the FWHM value. However, most users find it convenient to talk about FWHM instead of spectral width at 95% energy.

Spectral narrowing of a KrF laser is complicated by its short pulse duration (10 to 15 ns, FWHM) and UV wavelength. The short pulse results in very high intra-cavity power (~1 MW/cm$^2$), and the short wavelength can thermally distort optical materials due to their high absorption co-efficient at 248 nm. Also, the total number of round trips through the resonator (which includes the line narrowing optical elements) for a typical laser is small, about 3 to 4. If the single pass linewidth through the resonator is denoted by $)\Delta\lambda_1$, then the final linewidth $)\Delta\lambda_f$ after n passes is given by:

$$\Delta\lambda_f = \frac{\Delta\lambda_1}{\sqrt{n}}$$

Therefore, the single pass linewidth of the optical system should be, at most, a factor of two higher than the final linewidth. In fact, time resolved spectral measurements by Applicants fellow workers indicate that the spectral linewidth could decrease by a factor of two from the start of the pulse to the tail of the pulse. Therefore, the efficiency of converting the broadband spectrum to line narrowed spectrum (i.e. from 300 pm to <1 pm) of the optical system must be very high.

Figure 7:
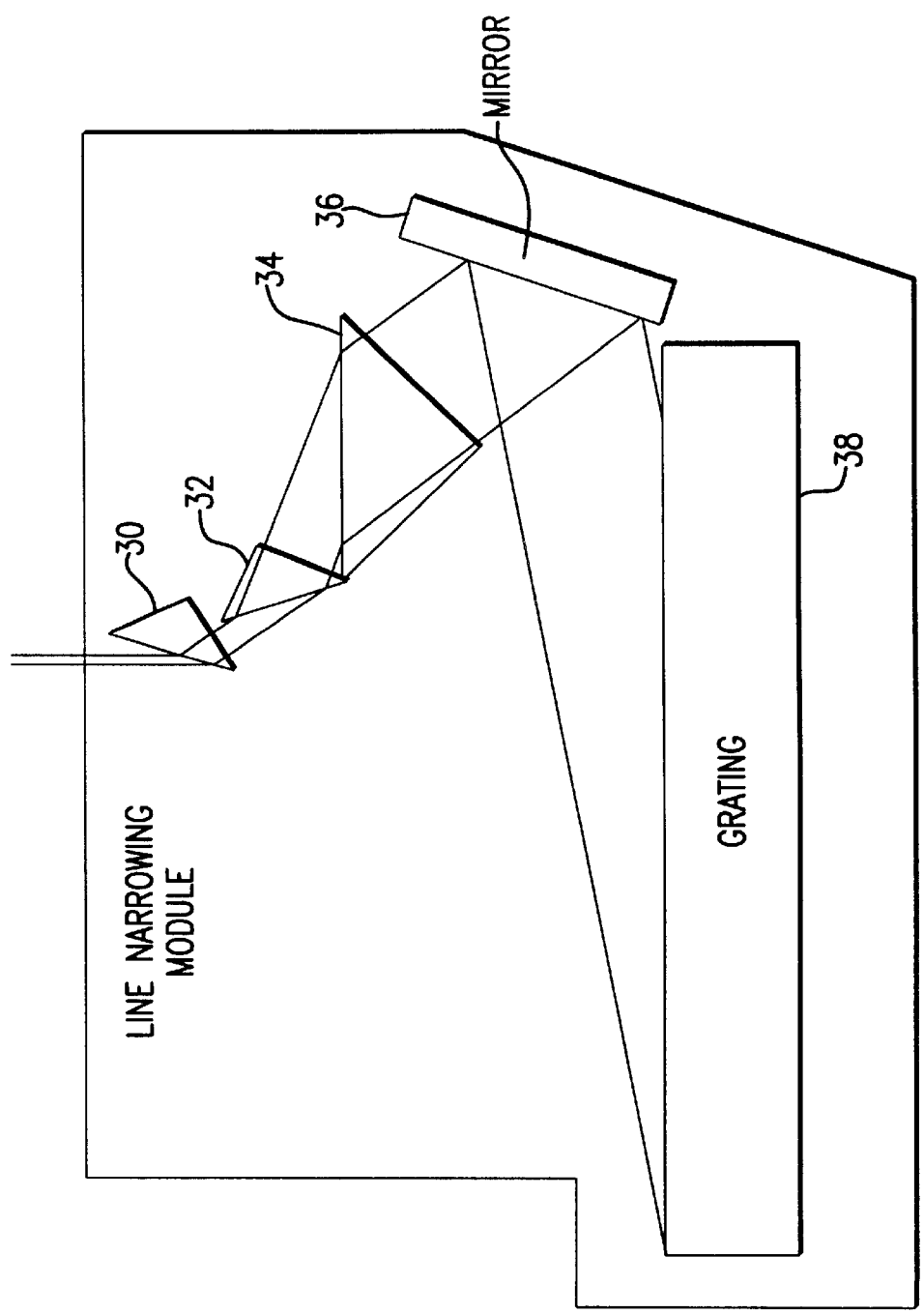
FIG. 7 is a sketch of the principal element of a line-narrowing module.

The common technique of line-narrowing the KrF laser is by introducing wavelength dispersive optical elements in the resonator. Three types of dispersive elements can be used: prisms, etalons and gratings. The use of a high dispersive grating in a Littrow configuration is the simplest and most effective spectral line narrowing technique. Because the grating is a dispersive element, the line-width is proportional to the beam divergence. To get narrow line-width, a small beam divergence is required. Hence, 2 slits and 3 prisms beam expanders are inserted in the laser resonator. The principal elements of a preferred line-narrowing module are shown in FIG. 7. These include 3 prisms; 30, 32 and 34, a tuning mirror, 3C and an eschelle grating, 38. The mirror is pivoted to change the wavelength of the laser.

Improved Spectral Performance

Applicants and their fellow workers have designed, built and tested laser KrF excimer laser equipment capable of meeting linewidth specifications of 0.50 pm at FWHM with 95% of the energy of the laser beam within 2 pm. These results have been demonstrated on new, mid-age and old discharge chambers for 80 million pulses proving that the system is capable of continuous performance within these specifications over the normal life of the equipment with usual maintenance. These results represent an approximately 50% improvement over the prior art narrow band excimer laser technology.

In order to achieve this improved performance Applicants have improved both the laser equipment and the operating parameters of the laser.

Reduction of Fluorine Consumption

In preferred embodiments of the present invention which have been built and tested by Applicants, great care was taken to eliminate materials from the discharge chamber that consume fluorine. Fluorine consumption in a discharge chamber is due to fluorine reaction with materials in the chamber. These reactions typically produce contaminants, which result in deterioration of laser performance. In order to minimize fluorine consumption, this preferred embodiment include the following specific features:

- The chamber walls are aluminum coated with nickel.
- The electrodes are brass.
- All metal O-rings are used as seals.
- Insulators are all ceramic and fluorine compatible.
- Alumina is applicants preferred insulator material.
- An electrostatic filter is provided as in prior art designs to filter contaminants produced during operation.
- The fan unit is driven using a magnetically coupled motor located outside the sealed discharge chamber using a prior art technique.
- During manufacture, parts are precision cleaned to remove potential contaminants.
- After assembly, the chamber is passivated with fluorine.

Reduction of Nominal Fluorine Concentration

This preferred embodiment requires substantial changes in operating procedures and parameters of the laser system in order to achieve the desired very narrowband output. The fluorine concentration in reduced from 0.1% (30 kPa) to about 0.06% (18 kPa). The total gas pressure is about 300 kPa. (The Kr concentration is maintained at the prior art level of about 1.3% and the remainder of the laser gas is neon.) During operation, fluorine will be gradually depleted. Constant pulse energy is obtained by gradually increasing the laser operating voltage in accordance with prior art techniques. Injections of a mixture of fluorine and neon are made periodically (typically at intervals of about 1 to 4 hours) to make up for the depletion of fluorine in accordance with techniques well known in the excimer laser prior art. During this procedure, the fluorine concentration is preferably maintained within the range of between about 0.055% and 0.065% and the operating voltage is maintained within a corresponding range appropriate to maintain constant pulse energy. For example, in a preferred embodiment this range was 670 Volts to 790 Volts.

Increase in Reflectivity of Output Coupler

In this preferred embodiment of the present invention the reflectivity of the output coupler has been increased from about 10% which was typical of prior art narrow band excimer lasers to about 30%. This was done to help make up for the loss of laser efficiency resulting from the reduced fluorine concentration.

Switch to Calcium Fluoride Prisms

The change in the reflectivity of the output coupler from 10% to 30% had the effect of approximately doubling the light passing through the line-narrowing module. The additional heat generated by this additional illumination in the prior art fused silica prisms caused thermal distortion in the prisms. To solve this problem the fused silica prisms were replaced with calcium fluoride prisms. Calcium fluoride has higher thermal conductivity and could handle the additional energy without unacceptable distortion.

Fluorine Reduction

Figure 10:
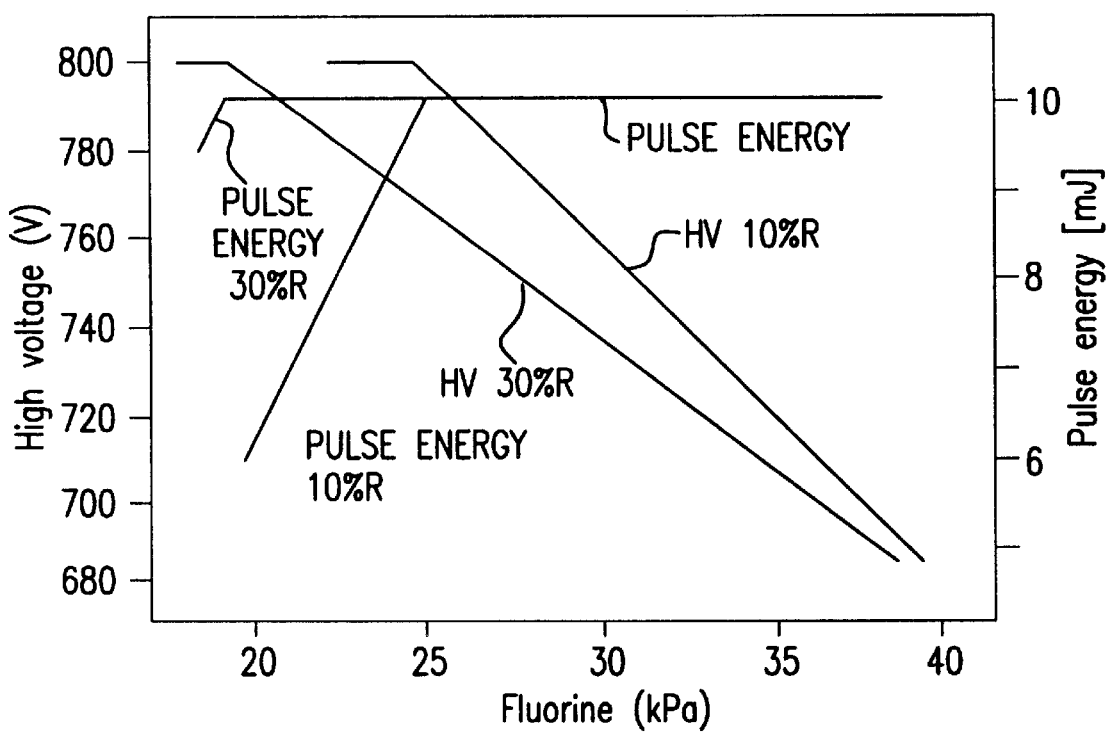
FIG. 10 shows the relationship between fluorine, operating voltage and pulse energy.
Figure 11:
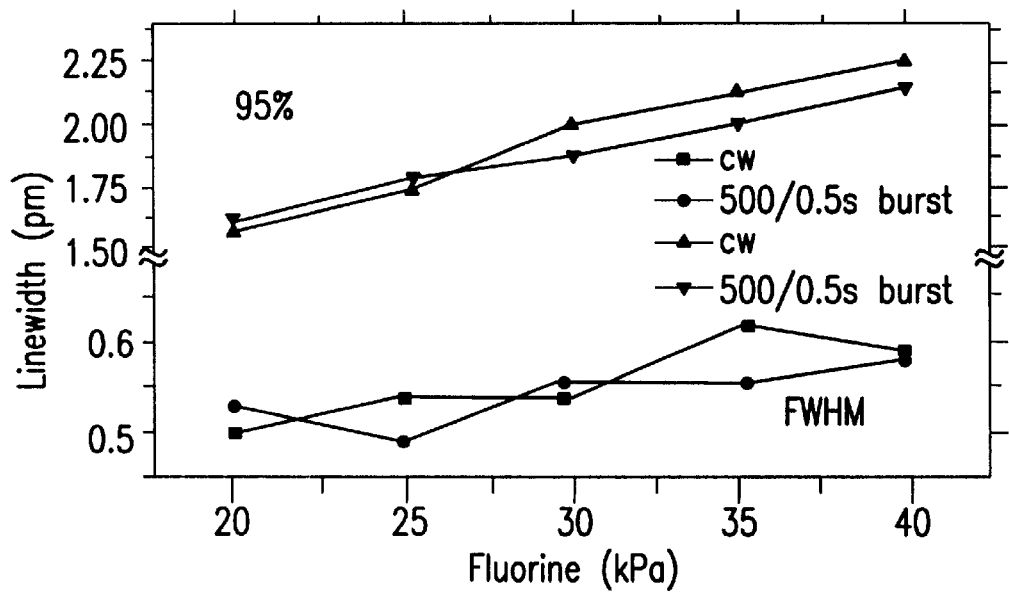
FIG. 11 shows the variation of line width with fluorine concentrations.

FIG. 10 describes the relationship between operating voltage, fluorine concentration and pulse energy. This graph shows that as the fluorine concentration decreases the voltage must be increased to maintain the desired output of 10 mJ per pulse. However, in this particular embodiment the upper limit on the operating voltage is 800 Volts. Note that with a 10% R output coupler the lowest fluorine concentration corresponding to an output of 10 mJ would be 25 kPa at which point the operating voltage would have risen to 800 Volts. However with a 30% R output coupler, the fluorine concentration could be reduced to as low as about 20 kPa while still maintaining a 10 mJ pulse energy with the operating voltage at slightly under 800 Volts. FIG. 11 shows actual test results of reducing the fluorine concentration on line width (measured at FWHM and at 95% pulse energy) for both continuous pulses at 1000 Hz and for 500 pulse bursts and 1000 Hz. For this particular test the output coupler had a 25% reflectivity. Typical laser pulse shapes for prior art KrF systems and these very narrowband KrF lasers are compared in FIGS. 12A and 12B. Note that with the very narrowband lasers, energy is shifted to the latter part of the pulse, which represents photons, which have had the benefit of more trips through the line-narrowing module. As a result, the integrated pulse spectral linewidth of the laser is reduced.

BURST MODE OPERATION

As indicated in the Background section of this specification, a typical mode of operation of a KrF laser is a "burst mode" in which bursts of about 125 pulses are produced at the rate of 1000 pulses per second. The burst lasts for about 125 milliseconds and there typically is a "dead time" of a fraction of a second between bursts. Applicants' KrF laser contains about 0.017 cubic meters of laser gas and the flow rate of gas between the electrodes produced by blower 10 is about 0.228 cubic meters per second. This would imply a total gas circulation time of about 75 milliseconds; however, flow in the chamber is far from uniform and portions of the gas circulates much quicker. The speed of the gas between the electrodes is about 20 meters per second and the Applicants estimate that the fastest gas makes the trip in about 20 milliseconds. Applicants have discovered a "slug effect" generated by the first or the first few pulses in a burst. This slug effect is shown in FIG. 13 that is a plot of pulse energy for each of the 123 pulses of a typical burst of 123 pulses averaged over 50 bursts. There is a large drop-off after the first pulse and another large dip after the 21st pulse, i.e. about 21 milliseconds following the first pulse. This dip is extremely reproducible and the timing of the dip is in proportion to the fan speed. Applicants do not know the exact cause of this first 40 seconds of very reproducible erratic performance but have identified it as the "slug effect" and believe it is attributable to chemical effects generated when "clean" laser gas passing between the electrodes is blasted with 20,000 volts during the first pulse or the first few pulses. The gas passing between the electrodes during the first 30 milliseconds is substantially all "clean" laser gas but after about 20 milliseconds, gas electrocuted during the first pulse begins to pass back between the electrodes. After about 39 milliseconds into the burst, the gas in the laser is thoroughly mixed and the slug effect disappears.

GAS ADDITIVES

Applicants, through their experimentation have discovered that substantial improvements in laser performance can be realized by the addition of very small quantities of selected gases. Prior art teases that about 10 to 50 ppm oxygen improves energy stability. However, these quantities of oxygen produce a decrease in the power output which tends to outweigh the improvements in stability. Applicants have discovered that smaller quantities of oxygen provide significantly improved stability without significant detrimental effects. Applicants have also discovered that the addition of very small quantities of heavy noble gases provides substantial improvements without significant detrimental effects.

Xenon Additive

Figure 8A:
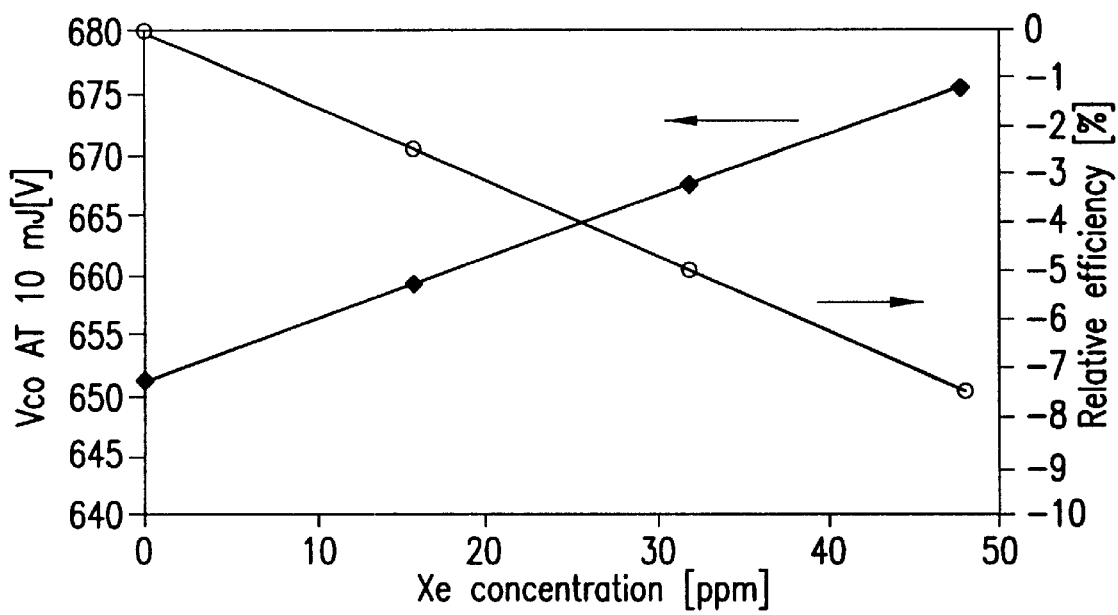
FIGS. 8A–8J show results of an additive of Xe to a :KrF laser.

The effect of xenon additives on operating voltage and efficiency are given in FIG. 8A. The rate of efficiency decrease is about 0.15% per 1 ppm of xenon. Energy stability was noticeably improved for all xenon concentrations, but exhibited a slight maximum around 30 ppm. This maximum is not apparent from the drawing. All subsequent tests were performed with a xenon concentration of 30 ppm.

Figure 8B:
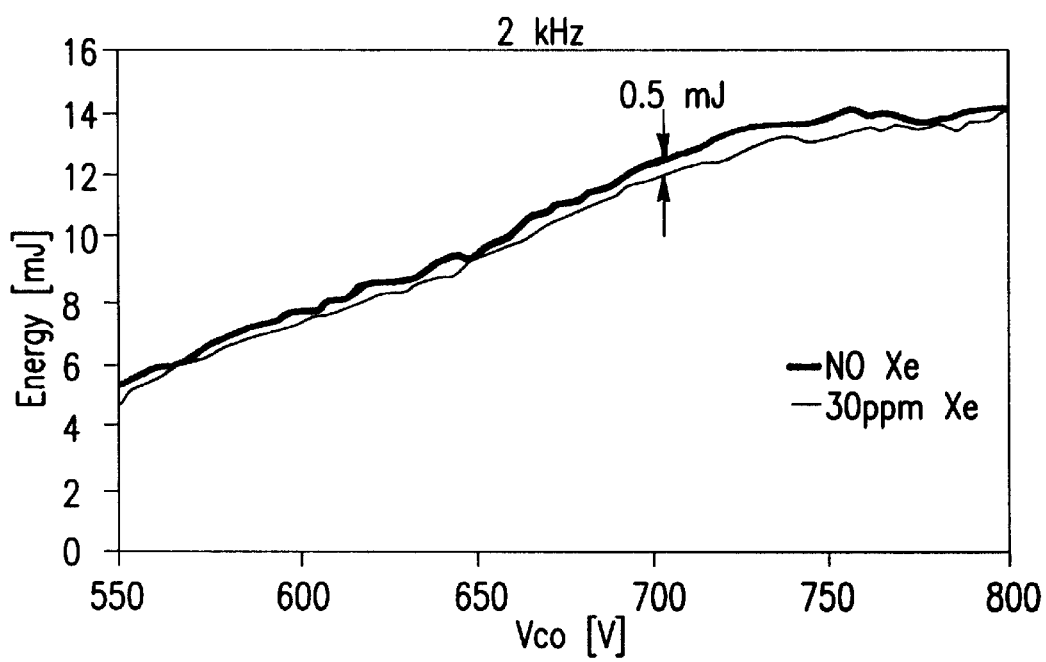

The energy versus voltage characteristic is given in FIG. 8B. The energy is lower with xenon over the entire range.

Figure 8C:
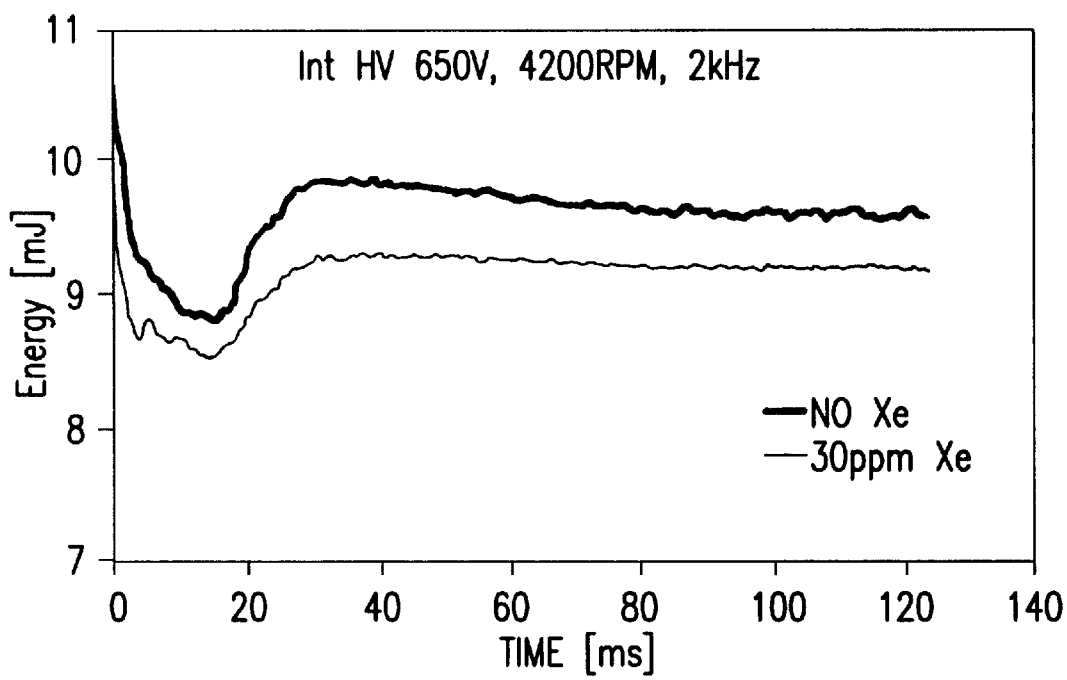
Figure 8D:
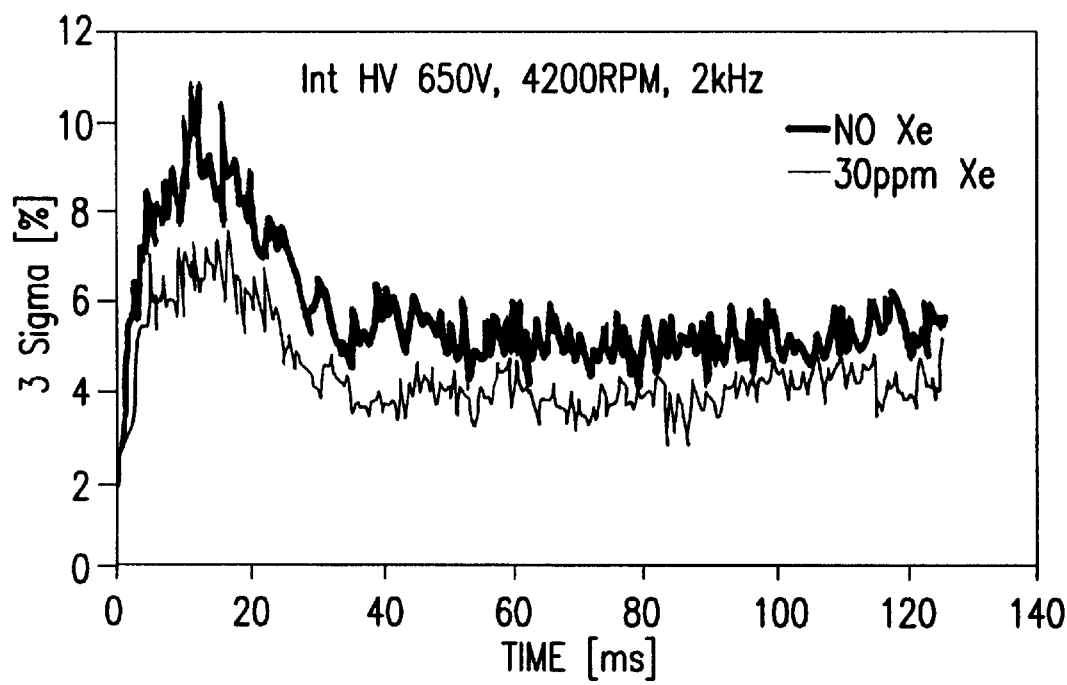

The burst transients are compared in FIGS. 8C and 8D. With xenon the energy transient is reduced, especially for the first ten pulses, which makes it easier on the energy algorithm. A major improvement with xenon is found in the energy stability, which is reduced, for all pulse numbers. This is in contrast to the effect of oxygen which only works on the reentrant. In fact, this chamber does not exhibit any reentrant, so the reentrant effect of xenon could not be confirmed with this chamber. For a blower speed of 4200 rpm the reentrant should occur at about 20 ms. (Note, subsequent tests with chambers that do exhibit a reentrant effect confirm that 30 ppm xenon does produce at least a small reduction in the reentrant effect.

Figure 8E:
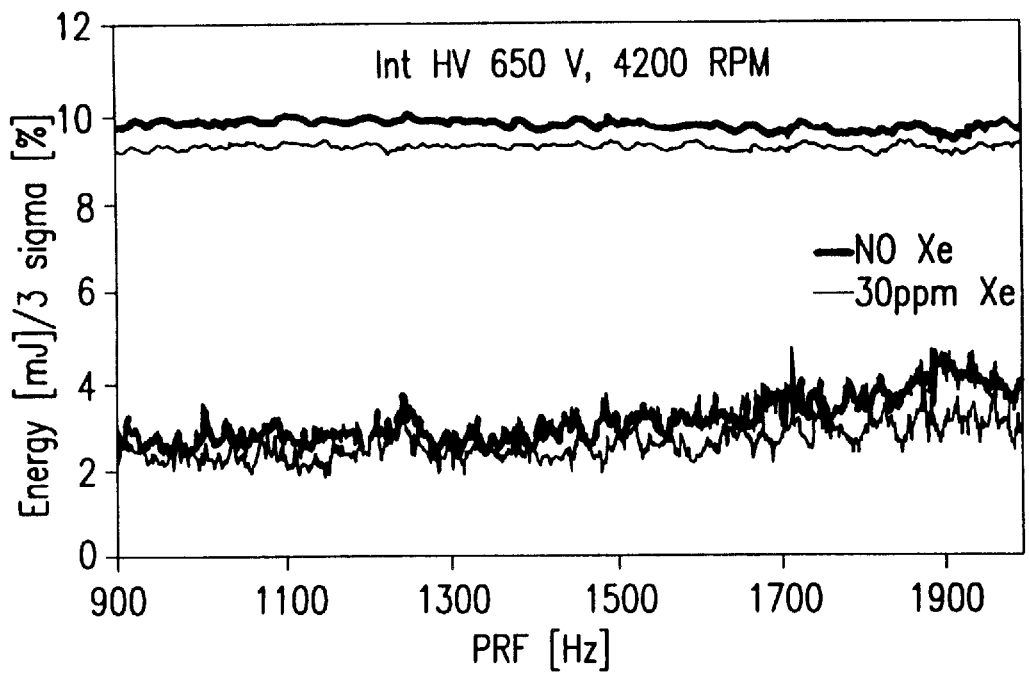
Figure 8F:
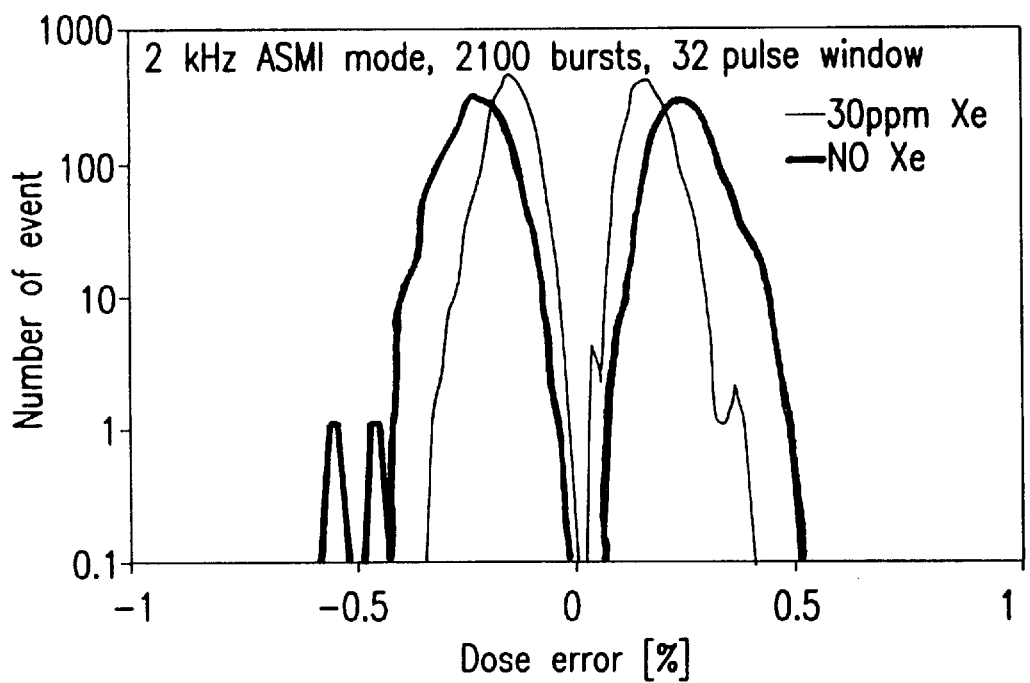

The laser energy is almost independent of repetition rate (see FIG. 8E), with the xenon mixture giving consistently lower values. By contrast, the improvement in dose stability with xenon is most noticeable at higher pulse rates. At 1 kHz the energy stability is probably dominated by effects unrelated to discharge stability such as noise in the data acquisition and high voltage power supply regulation. We are using two paralleled 5000 power supplies with >3V of dither. The dose stability in a 2 kHz mode is displayed in FIG. 8F. Addition of 30 pm of xenon reduces the dose error by about 0.1%. This is a substantial improvement.

Figure 8G:
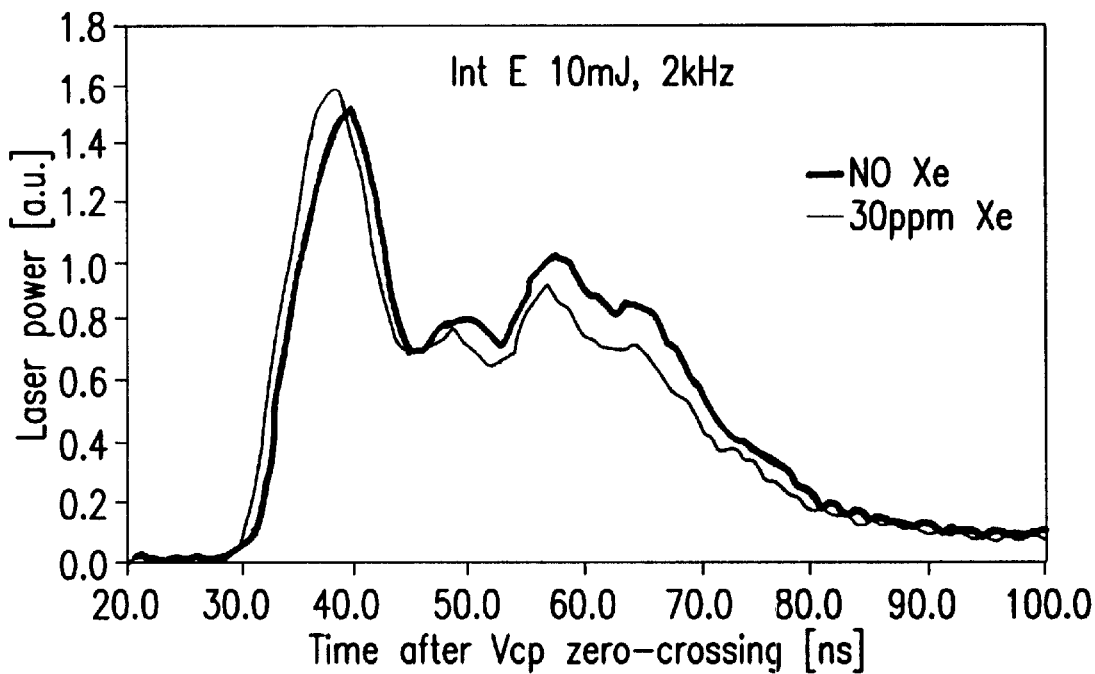

No effect of xenon on any other beam parameters (spatial profiles and divergence, linewidth) was observed. Occasionally, it appeared that xenon mixtures produce narrower linewidth. However, this was most likely an artifact produced by the fused silica beam expanding prisms. It takes more time to generate a xenon mixture, which allows the prisms to cool down. Recorded linewidths were 0.65 pm FWHM and 1.90 pm 95%. The linewidths would possibly be narrower with $CaF_2$ prisms because of better thermal properties. A comparison of the temporal profiles at 10 mJ of energy is displayed in FIG. 8G. The 30 ppm xenon mixture exhibits a typical waveform for higher charging voltages (667V 30 ppm Xe, 651V w/o Xe), namely larger initial spike and shorter duration. From this, one would expect a larger linewidth with xenon, which was not observed. Nevertheless, the differences are very small and only reflect one particular shot. Unfortunately, no averaged pulse profiles were recorded.

Explanation of Results of Xenon Tests

Figure 8H:
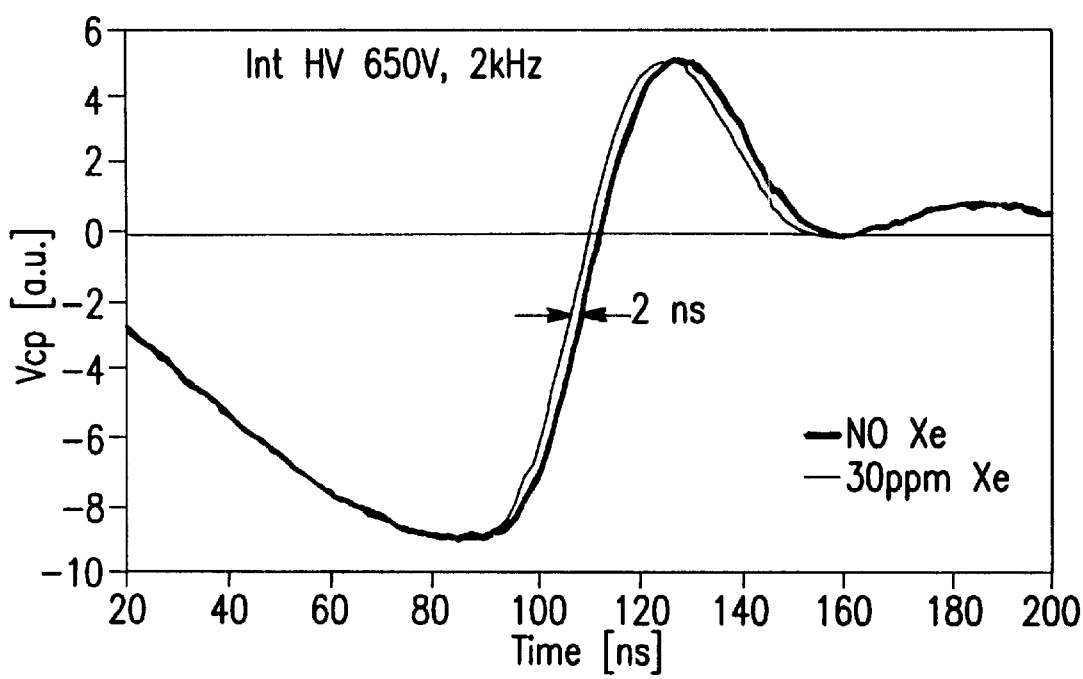

So why does xenon help at all and why in such small concentration? Some insight is gained by observing the peaking capacitor voltage Vcp (FIG. 8H). For the same charging voltage Vco of 650V, gas breakdown occurs 2 ns earlier with a xenon mixture. The obvious explanation is improved pre-ionization. Xenon can be ionized by light shorter than 93 nm whereas krypton and neon have thresholds of 85 nm and 58 nm, respectively (R. S. Taylor, IEEE JQE v.31, p.2195, 1995). Therefore, xenon can use a large part of the corona light that otherwise would just be transmitted. Even at 30 ppm the xenon concentration is seven orders of magnitude larger than typical pre-ionization electron densities. This means, the amount of xenon atoms is not a limiting factor. The absorption cross section of xenon is 1500 $cm^{-1}$ which translates into a 50% transmission after 5 cm for 30 ppm at 315 kPa. This would explain why higher xenon concentrations are less efficient, the 90 nm light is already being filtered out very close to the PI tube.

There are other scenarios possible like faster current avalanching due to the lower ionization potential of xenon. This, however, is hindered by the low concentration. Another possibility is a change in the spectral content of the corona light, which may have beneficial effects. In fact, the discharge containing xenon visually appears much brighter, primarily due to yellow components.

Figure 8I:
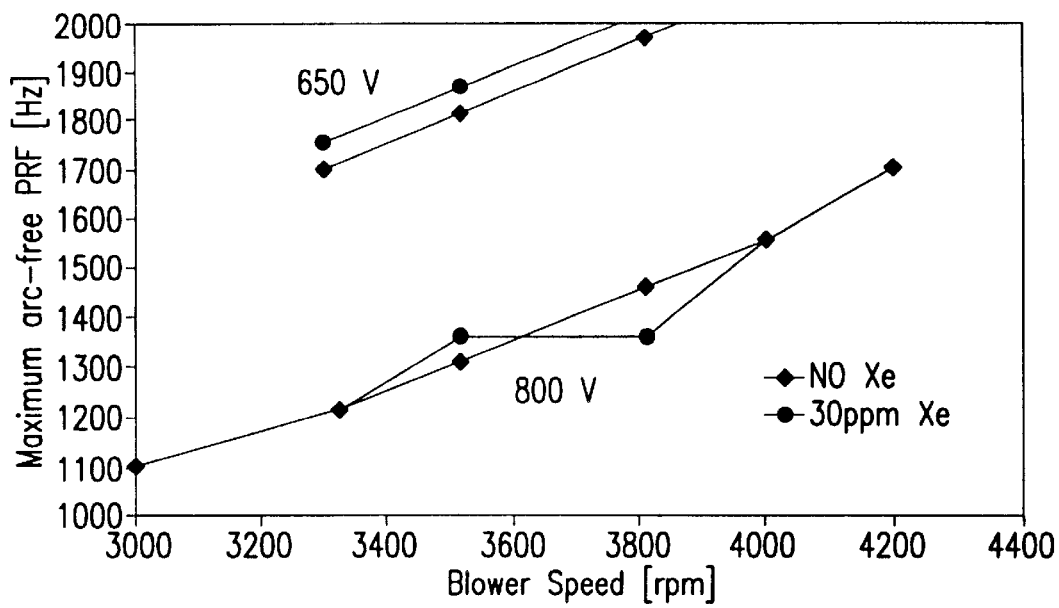
Figure 8J:
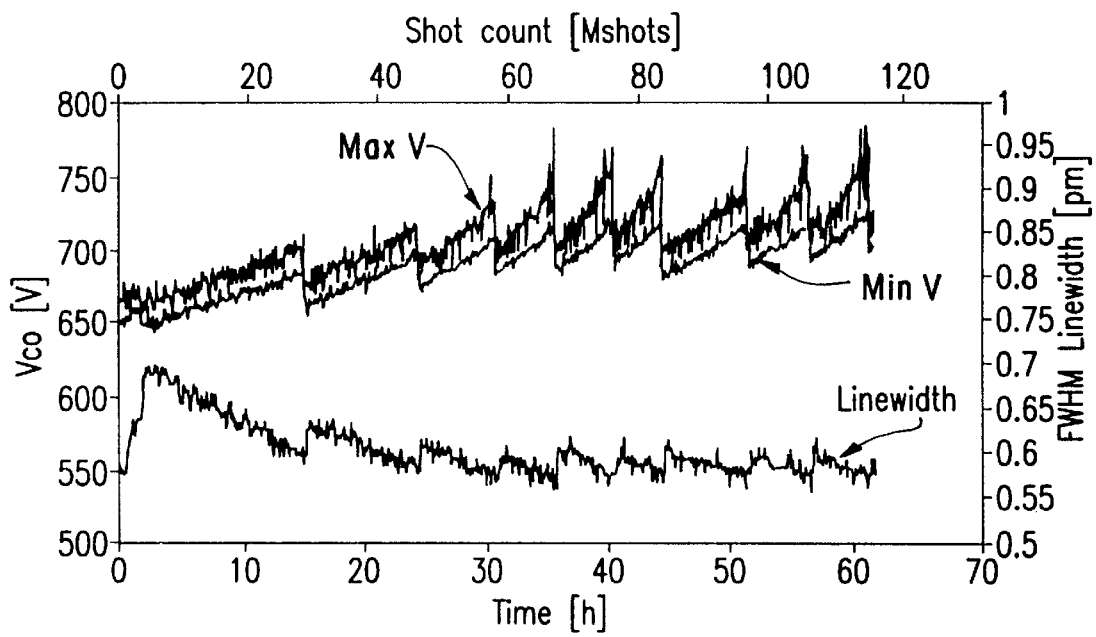
Figure 9:
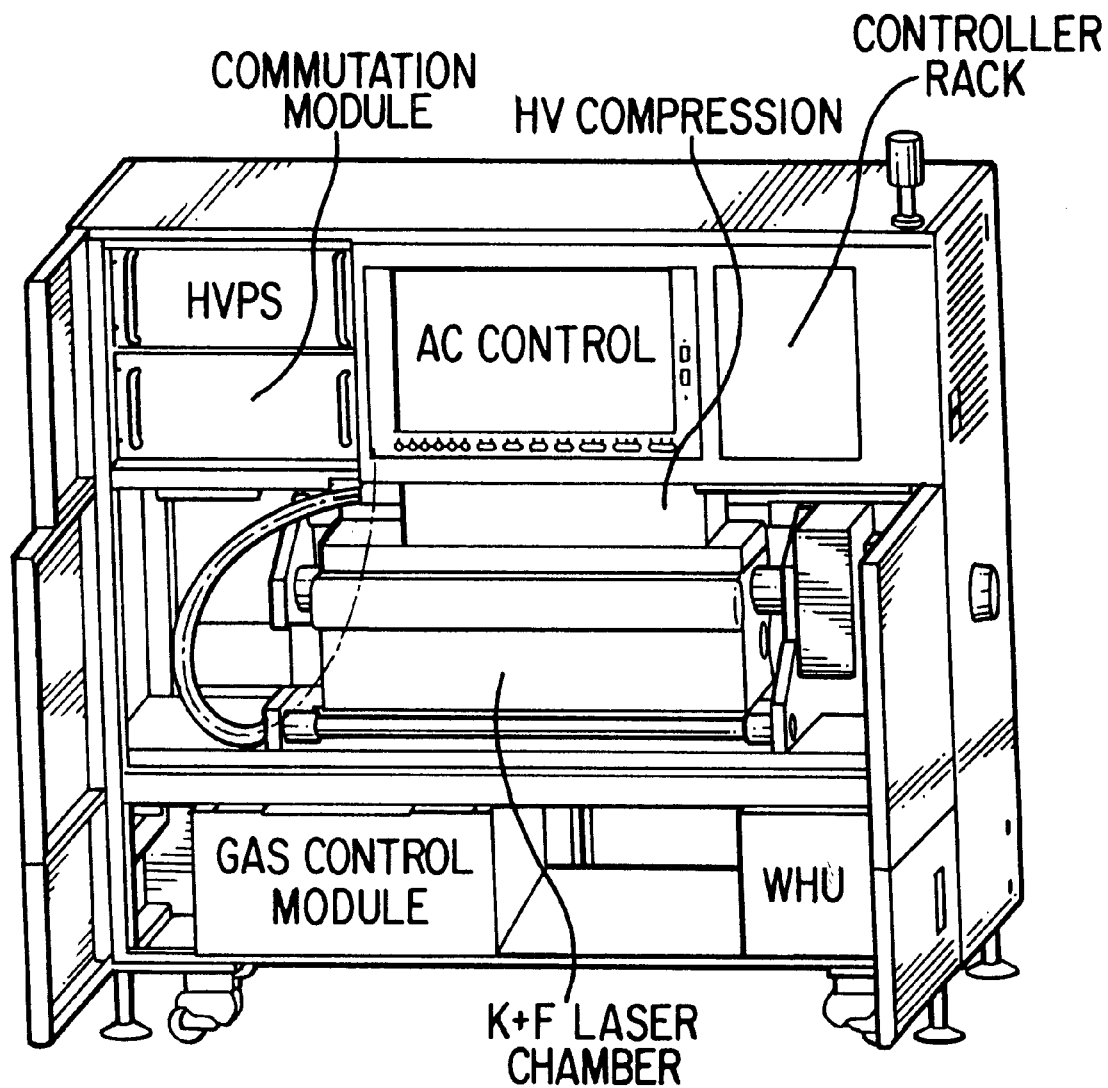
FIG. 9 is a drawing of a prior art commercial KrF lithography laser.

Better pre-ionization may also help the minimum clearing ratio (a measure of gas flow between electrodes between pulses). There is a very slight improvement for lower charging voltages (FIG. 8I). At 650V (10 mJ) 3800 rpm is barely enough to prevent down-stream-arcing and dose stability improves when going to 4200 rpm. At 800V arcing is much more severe, although largely aggravated by blips.

Xenon Effects Survives Refills

Very early in the experiments a strange phenomenon was encountered: the beneficial effect of xenon survives refills. Due to this, detailed studies on the influence of the exact xenon concentration became difficult, or at least time consuming. What is happening is that after the laser was operated with a xenon containing mixture and refilled without xenon, the energy stability would stay at a low level. Not as good as with xenon, but somewhere in between. A number of experiments were conducted to help understand the mechanism of this memory effect. The difference in dose stability between a truly xenon-free mixture and a preconditioned mixture is only 0.05%. This difference is too small to allow any hard conclusions, so only some general trends can be outlined.

There are two possibilities; either xenon physically stays in the chamber or it altars the chamber in a long lasting way. Such an alteration could be smoothing or cleaning of electrodes or windows. A first refill after a xenon fill was operated for four hours and 2 million shots without losing good stability. Four to five refills, however, with much fewer shots and in a shorter time completely bring the chamber back to normal. This rather supports the theory that xenon stays in the chamber. The same conclusion is drawn from the fact that simply filling with xenon and never firing the laser also helps subsequent fills.

Contrary to energy stability, the operating voltage is entirely independent of the previous history. This means that not a large percentage of the xenon can be carried over to the next fill. There are different ways how xenon could remain in the laser. Since xenon is a very heavy gas it may collect preferably on the bottom or in the MFT when the blower is not running. In that case, it should be removable by pumping the chamber with the leak checker to a pressure much lower than what is available with the membrane pump. This still did not prevent the memory effect. Which would suggest that xenon gets trapped due to its large size in porous materials or virtual leaks in the chamber.

Weekend Xenon Test

FIG. 8I presents a weekend run in 2 kHz mode with a 30 ppm xenon mixture. No data are available without xenon, so this is merely a statement how well the chamber can perform. The total pressure did not increase during the test. The linewidth increases for the first 2 hours, typical of heating of the fused silica LNP. Thereafter, the normal trend of decreasing linewidth for decreasing fluorine concentration is observed. However, the linewidth continues to decrease and only stabilizes after 3 injects.

The voltage continues to increase and also only stabilizes after 3 injects. In conjunction with the linewidth data the voltage increase is most likely not due to any impurities but simply because the mixture gets leaned out. Once the voltage is increased the injection intervals shorten because the discharge is no longer blip-free.

During the test a fantastically low fluorine consumption rate was observed. Immediately after the refill, the laser was running for an incredible 15 hours and 28 million pulses without injection.

In summary, this test shows that with an addition of a small amount of xenon to the gas mixture a KrF chamber can operate within specifications for 95% linewidth and dose stability. Very low fluorine consumption was observed.

Heavy Noble Gas Additives in ArF Laser

Applicants have conducted experiments with very small quantities of Kr and Xe added to a typical ArF gas mixture. (A typical mixture is about 0.08 to 0.12% fluorine, 3.5% argon and the rest neon.) Both Kr and Xe substantially reduced the average 3 sigma of the laser. Without the additives the 3 sigma for the laser was about 5%. About 6–10 ppm of Xe reduced 3 sigma to about 4% (a 20% improvement). For the same improvement with Kr about 40 ppm were required.

As with the KrF laser the additives reduced the output of the laser. For the same discharge voltage pulse energy was reduced by about 1% for each ppm of Xe and about 0.2% for each ppm of Kr. Thus, an 8 ppm of xenon the pulse energy would be reduced by 8% and 40 pm of Kr would reduce the output by roughly the same amount about 8%.

Very Small Quantity Oxygen Addition

Figure 14:
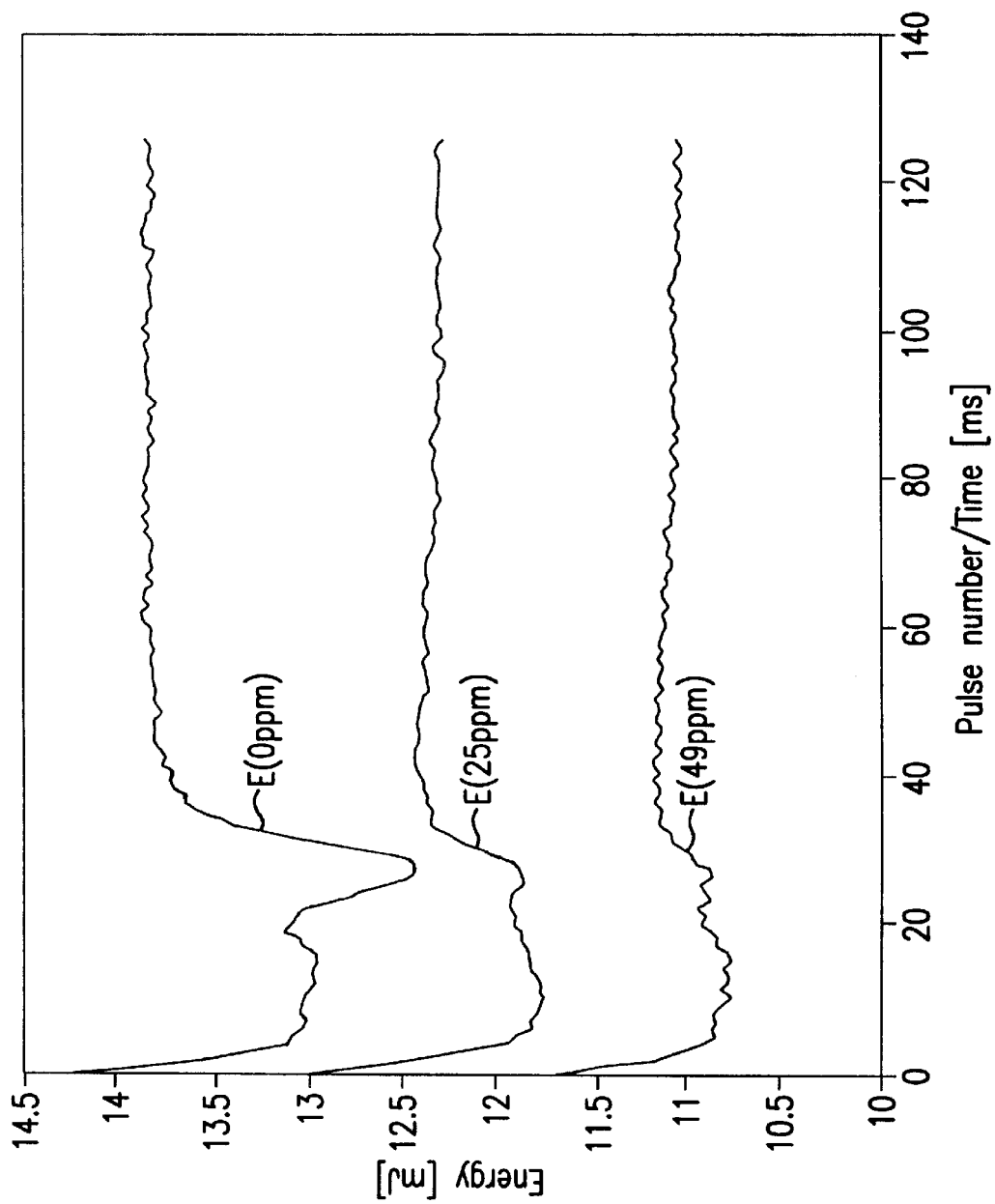
FIG. 14 is a chart similar to FIG. 13 showing average pulse energy with oxygen at 0 ppm, 25 ppm and 49 ppm.
Figure 15:
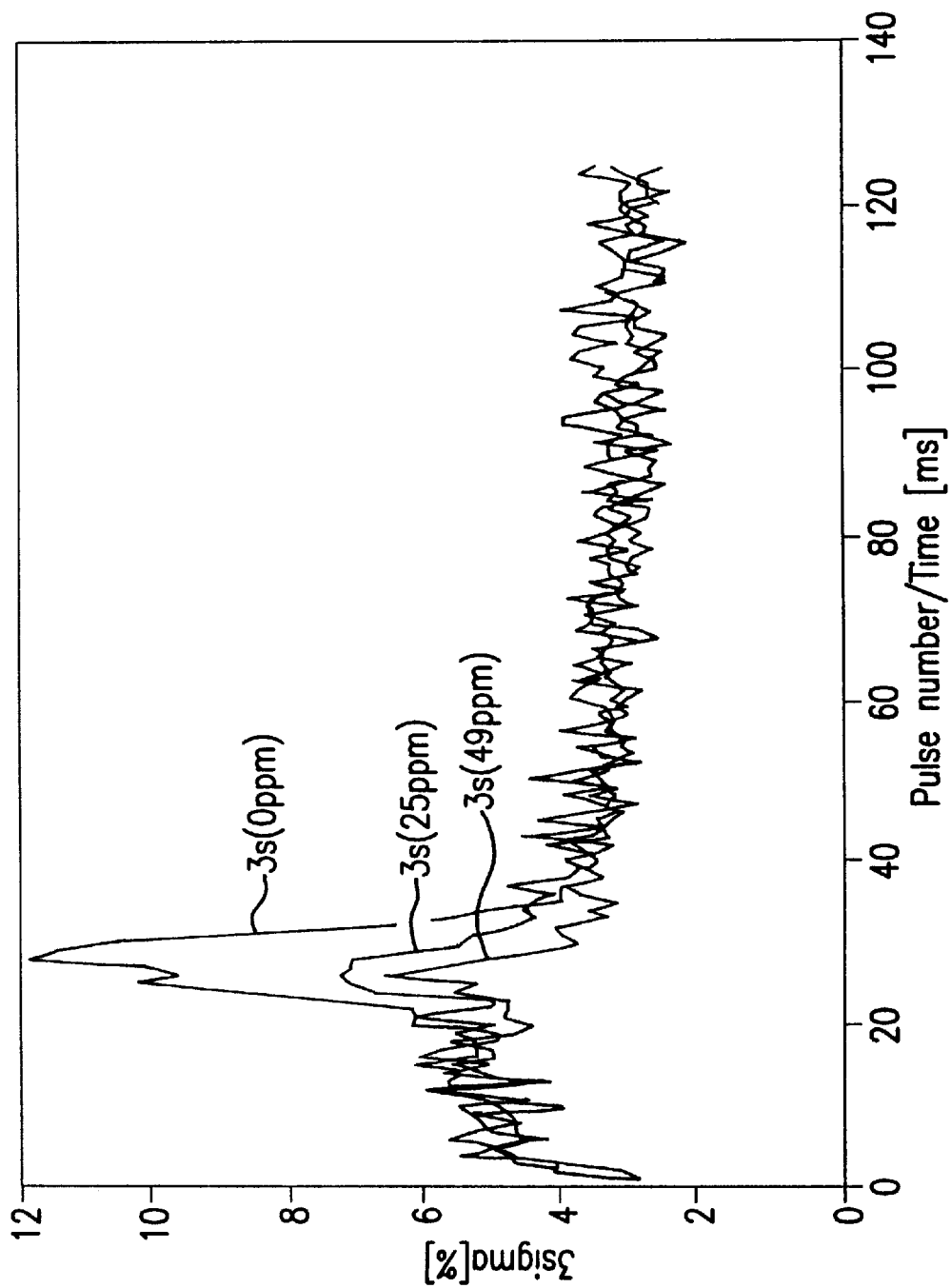
FIG. 15 is a chart showing 3-sigma statistics of the data plotted in FIG. 14.

FIGS. 14 and 15 show the effect on the slug effect in a KrF laser of adding minute quantities of oxygen to the laser gas. FIG. 14 shows a dramatic reduction in the energy decrease occurring at about 22 to 35 milliseconds into the burst. FIG. 15 shows that the 3-sigma variation is also dramatically reduced with the addition of oxygen in the range of about 25 to 49 parts per million, but 25 ppm produces a reduction of about 10% in the pulse energy and 49 ppm produces a reduction of about 20% Applicants have determined about 5 ppm provides significant improvement in stability without significant detrimental effects.

Argon Fluoride Laser—Elimination of Gas Refill Syndrome with Oxygen

Applicants have discovered that the addition of oxygen also improves performance of very narrow band ArF lasers. Applicants have identified what they call a gas refill syndrome. They have discovered that immediately after replacing the laser gas in an ArF very narrow band laser, the laser performs very poorly in that the pulse energy is substantially reduced. However, after setting overnight, the next morning the laser performs within specification.

This gas refill syndrome was eliminated with the addition of an extremely small quantity of oxygen such as about 2 to 3 parts per million. Thus, the preferred laser gas mixture for the very narrow band ArF excimer laser is:

3.5 percent argon 0.1 percent fluorine

2–3 parts per million oxygen remainder neon to 3 atmospheres.

Additional quantities of oxygen were added but the oxygen addition beyond 5 ppm had no significant beneficial effect. Recommended ranges of oxygen in both KrF and Arf lasers is between about 2 to about 7 ppm. Recommended ranges of Xe for KrF lasers is less than about 30 to 40 ppm. Recommended ranges of Kr for ArF lasers is less than about 40 ppm and recommended Xe ranges is less than about 10 ppm.

Although this very narrow band laser has been described with reference to particular embodiments, it is to be appreciated that various adaptations and modifications may be made to the invention. Although Applicants did not test radon in its lasers, they have concluded that very small quantities of radon gas would improve energy stability without substantial negative effects. Radon should be easier to ionize than any other noble gas and it will not form long-lived compounds with fluorine. Therefore, it should like xenon in the KrF laser and krypton in the ArF and KrF lasers aid preionization. Applicants expect that the best concentration for radon would be similar to those discussed above for Xe and Kr. For example, sources of oxygen can be pure oxygen or any of the oxygen referred to in U.S. Pat. No. 5,307,364. Also, the source of oxygen could be a solid such as aluminum oxide or potassium, which could be contained within the chamber environment and the oxygen emission, could be controlled with temperature. Therefore, the scope of the invention is to be limited only by the appended claims and their legal equivalent.

What is claimed is:

1. An excimer laser comprising

A. a laser chamber comprised of fluorine compatible materials and containing:

(1) two elongated electrodes;

(2) at least one preionizer; and (3) a laser gas defining a total pressure and comprised of a first noble gas, fluorine, a buffer gas, and a stabilizing additive of less than 100 ppm; said stabilizing additive being chosen from a group consisting of: oxygen at less than 10 ppm and a quantity of a second noble gas which is heavier than said first noble gas.

2. A laser as in claim 1 wherein said first noble gas is krypton and said stabilizing additive is xenon.

3. A laser as in claim 1 wherein said first noble gas is krypton and said stabilizer additive is radon.

4. A laser as in claim 1 wherein said first noble gas is argon and said stabilizing additive is krypton.

5. A laser as in claim 1 wherein said first noble gas is argon and said stabilizing additive gas is xenon.

6. A laser as in claim 1 wherein said first noble gas is argon and said stabilizing additive gas is radon.

7. A laser as in claim 1 wherein said stabilizing gas is oxygen in a concentration of between 2 and 7 parts per million.

8. An excimer laser as in claim 1 wherein said excimer laser is a narrow band excimer laser and said fluorine has a partial pressure of less than 0.10 of the total pressure.

9. A narrow band excimer laser as in claim 8 and further comprising an output coupler having a reflectance of at least 25%.

10. A narrow band excimer laser as in claim 8 wherein said at least one prism is comprised of calcium fluoride.

11. A narrow band excimer laser as in claim 8 wherein at least one prism is three prisms, all comprised of calcium fluoride.

12. A narrow band excimer laser as in claim 8 wherein the partial pressure of fluorine is less than 0.06 percent of the total gas pressure.

13. A narrow band laser as in claim 8 wherein said excimer laser is an ArF excimer laser and the concentration of oxygen is less than 5 ppm.

* * * * *